(12) United States Patent
Hsieh et al.

(10) Patent No.: US 7,161,238 B2
(45) Date of Patent: Jan. 9, 2007

(54) STRUCTURAL REINFORCEMENT FOR ELECTRONIC SUBSTRATE

(75) Inventors: George Hsieh, Portland, OR (US); David Shia, Bellevue, WA (US); Tom E. Pearson, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 94 days.

(21) Appl. No.: 10/335,092

(22) Filed: Dec. 31, 2002

(65) Prior Publication Data

US 2004/0124517 A1 Jul. 1, 2004

(51) Int. Cl.
*H01L 23/12* (2006.01)

(52) U.S. Cl. .................. 257/704; 257/707; 432/122; 432/121

(58) Field of Classification Search ............... 257/706, 257/707, 704, 718, 726, 727, 697, 698; 438/122, 438/118, 119, 612, 121; 361/803, 780
See application file for complete search history.

(56) References Cited

U.S. PATENT DOCUMENTS

| | | | |
|---|---|---|---|
| 5,371,404 A * | 12/1994 | Juskey et al. ............ | 257/659 |
| 5,528,462 A * | 6/1996 | Pendse .................... | 361/767 |
| 5,561,323 A * | 10/1996 | Andros et al. ........... | 257/707 |
| 5,679,929 A * | 10/1997 | Greenfield et al. ...... | 174/261 |
| 6,212,074 B1 * | 4/2001 | Gonsalves et al. ...... | 361/717 |
| 6,304,452 B1 * | 10/2001 | Lo .......................... | 361/704 |
| 6,472,742 B1 * | 10/2002 | Bhatia et al. ............ | 257/713 |
| 6,501,658 B1 | 12/2002 | Pearson et al. | |
| 6,519,153 B1 | 2/2003 | Shia et al. | |
| 6,522,545 B1 | 2/2003 | Shia et al. | |
| 6,528,876 B1 * | 3/2003 | Huang ..................... | 257/706 |
| 6,542,367 B1 | 4/2003 | Shia et al. | |
| 6,590,771 B1 | 7/2003 | Sopko et al. | |
| 6,594,151 B1 | 7/2003 | Dixon et al. | |
| 6,682,802 B1 | 1/2004 | Hsieh et al. | |
| 6,691,407 B1 | 2/2004 | Pearson et al. | |
| 6,700,800 B1 | 3/2004 | Combs et al. | |
| 6,734,371 B1 | 5/2004 | Arrigotti et al. | |
| 6,760,232 B1 * | 7/2004 | Smith et al. ............. | 361/780 |
| 6,764,325 B1 | 7/2004 | Arrigotti et al. | |
| 6,791,189 B1 | 9/2004 | Pearson et al. | |
| 6,791,846 B1 * | 9/2004 | Smith et al. ............. | 361/803 |
| 6,822,867 B1 * | 11/2004 | Hsieh ...................... | 361/704 |
| 6,853,068 B1 * | 2/2005 | Djekic .................... | 257/706 |
| 6,880,243 B1 * | 4/2005 | Ireland ................... | 29/840 |
| 2002/0076522 A1 | 6/2002 | Hsieh et al. | |
| 2002/0181205 A1 | 12/2002 | Shia et al. | |

(Continued)

*Primary Examiner*—S. V. Clark
(74) *Attorney, Agent, or Firm*—Schwabe, Williamson & Wyatt, P.C.

(57) ABSTRACT

Embodiments of stiffening members in accordance with the present invention provide a mechanical support that is wave soldered to the frontside of the system substrate simultaneously with other wave soldered components. The stiffening member comprises a flat plate with a plurality of mounting pins. The number of mounting pins are predetermined to provide the plate with sufficient support to resist expected loading conditions when wave soldered in plated through holes on a system substrate. The mounting pins are adapted for insertion into plated through holes on the system substrate. The length of the mounting pins are predetermined to account for the height of the SMT component upon which it is attached, the thickness of the system substrate, and the desired amount of mounting pin protrusion from the backside of the system substrate. The stiffening members consume very little system substrate space while retaining a platform for heat dissipation.

27 Claims, 2 Drawing Sheets

U.S. PATENT DOCUMENTS

| | | |
|---|---|---|
| 2003/0007326 A1 | 1/2003 | Terhaar et al. |
| 2003/0011997 A1 | 1/2003 | Hsieh |
| 2003/0019097 A1* | 1/2003 | White .................... 29/832 |
| 2003/0103332 A1 | 6/2003 | Sopko et al. |
| 2003/0103337 A1 | 6/2003 | Dixon et al. |
| 2004/0003496 A1 | 1/2004 | Pearson et al. |
| 2004/0131824 A1 | 7/2004 | Hsieh et al. |
| 2005/0007748 A1* | 1/2005 | Callahan et al. ............ 361/809 |
| 2005/0024840 A1* | 2/2005 | Smith et al. ................ 361/803 |

* cited by examiner

STRUCTURAL REINFORCEMENT FOR ELECTRONIC SUBSTRATE

FIELD OF THE INVENTION

The present invention relates to electronic packaging and, more particularly, to structural reinforcement for electronic substrate.

BACKGROUND OF INVENTION

A microelectronic package comprises a microelectronic die electrically interconnected with a carrier substrate, and one or more other elements, such as electrical interconnects, a die lid, a heat dissipation device, among others. An example of a microelectronic package is an integrated circuit microprocessor. Interconnecting contacts on the carrier substrate with those on a system substrate provides electrical communication between the microelectronic die and external components. An example of a system substrate is a printed circuit board (PCB) in the form of a motherboard for a desktop computer. The system substrate is commonly assembled into a system that is housed within a frame or chassis, for example, the enclosure of a desktop computer.

More powerful microelectronic die that operate at increasingly high temperatures require the use of larger and heavier heat dissipation devices on the microelectronic package. An example of a heat dissipation device includes a heat sink. The added weight of the heat dissipation device can cause the system substrate to flex and sag, especially under dynamic loading conditions experienced during handling of the system.

Surface mount technology (SMT) interconnects are especially susceptible to damage due to system substrate flexing and sag. One example of a SMT interconnect is the ball grid array (BGA) wherein contact pads on the surface of the SMT component are interconnected with contact pads on the surface of the system substrate using solder balls. Any loading that would tend to cause one of the surfaces to become non-flat will put stress on the solder interconnections. For example, on a commonly used desktop motherboard, the BGA to board interconnects of the chipset next to the CPU can be damaged due to board flexure caused by shock & vibration of the CPU heat sink.

Stiffening bars have been used to provide mechanical stiffening for system substrates to resist sag and flexing. These are essentially small I-beams that are wave soldered to the frontside of the system substrate through holes at regular intervals. The stiffening bars are placed at strategic locations and orientations on the system substrate to reduce deflection in selected directions. Component placement on the system substrate, however, must accommodate placement of the stiffening bars, putting constraints on the use of available standardized system substrate designs. In addition, the mounting holes required by the stiffening bars are relatively large. In the typical desktop system, stiffening bars are not feasible considering the component density requirements of the motherboard. They are used mainly for workstation and server systems that are less size constricted.

Stiffening plates and load transfer plates are also available. Stiffening plates are plastic or metal plates that attach to the backside of the system substrate by rivets. The rivets require relatively large holes that are difficult to accommodate in smaller systems. Load transfer plates are used to attach the backside of the system substrate to the chassis for additional support. Both stiffening plates and load transfer plates require access to the backside of the system substrate and a backside assembly step during manufacturing. Backside assembly is not a process that is normally used in common desktop motherboard manufacturing, for example, which leads to increased assembly cost and complexity.

Improved structural reinforcements are required to mitigate damage to the interconnects of SMT component due to system substrate flexing. The structural reinforcements must accommodate locations on the system substrate that have high trace densities, for example, the CPU/chipset core of a motherboard. Further, the structural reinforcements must not displace the layout of the components or traces. Further, the structural reinforcements must accommodate the heat dissipation devices used, for example, with core area components.

DESCRIPTION

In the following detailed description, reference is made to the accompanying drawings which form a part hereof wherein like numerals designate like parts throughout, and in which is shown by way of illustration specific embodiments in which the invention may be practiced. It is to be understood that other embodiments may be utilized and structural or logical changes may be made without departing from the scope of the present invention. Therefore, the following detailed description is not to be taken in a limiting sense, and the scope of the present invention is defined by the appended claims and their equivalents.

Embodiments of stiffening members in accordance with the present invention provide a mechanical support that is wave soldered to the frontside of the system substrate simultaneously with other wave soldered components. The stiffening members do not require backside access or synchronization with chassis design. The stiffening members consume very little system substrate space while retaining a platform for heat dissipation. It can be a platform for chipset thermal solution or remain a stand-alone mechanical solution.

Figure 1:
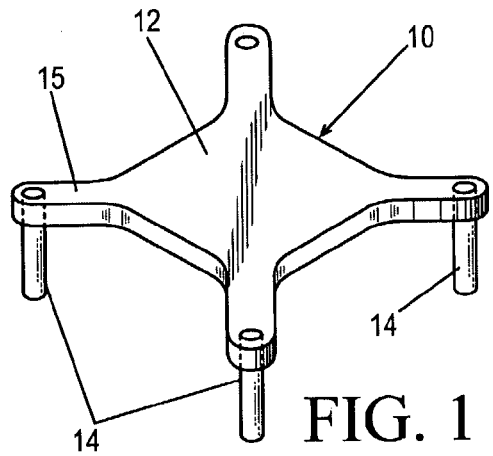
FIG. 1 is a perspective view of an embodiment of a stiffening member in accordance with the present invention.
Figure 2A:
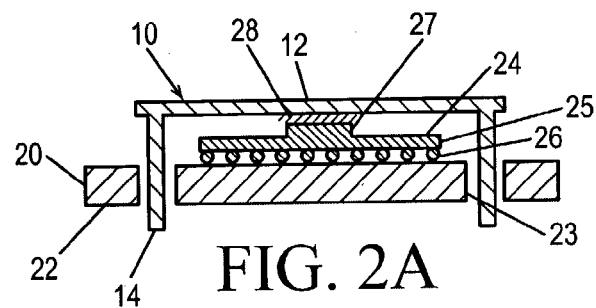
FIGS. 2A and 2B are side views of the system substrate and a SMT component with the addition of the stiffening member in accordance with an embodiment of the method of the present invention.

FIG. 1 is a perspective view of an embodiment of a stiffening member 10 in accordance with the present invention. FIG. 2A is a cross-sectional view of the stiffening member of FIG. 1. The stiffening member 10 comprises a flat plate 12 in the form of a reduced square having an extension 15 at each corner from which a mounting pin 14 is coupled. The four mounting pins 14 are predetermined to provide the plate 12 with sufficient support to resist expected loading conditions when wave soldered in plated through holes 23 on a system substrate 20. The mounting pins 14 are adapted to be inserted into plated through holes 23 on the system substrate 20. The length of the mounting pins 14 are predetermined to account for the height of the SMT component 24 upon which it is attached, the thickness of the system substrate 20, and the desired amount of mounting pin 14 protrusion from the backside 22 of the system substrate 20.

Figure 2B:
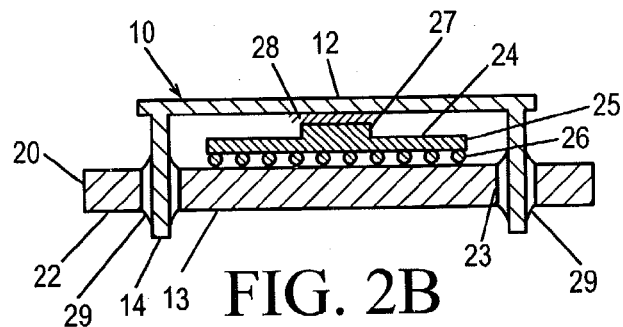

FIGS. 2A and 2B are side views of the system substrate 20 and a SMT component 24 with the addition of the stiffening member 10 in accordance with an embodiment of the method of the present invention. A system substrate 20 is provided having an attached SMT component 24 and a plurality of plated through holes 23 about the periphery of the SMT component 24. A stiffening member 10 is provided having a stiffening plate 12 from which a plurality of mounting pins 14 project. A topmost portion 27 of the SMT component 24 is provided with a layer of thermal interface material 28. The mounting pins 14 of the stiffening member 10 are inserted into the plated through holes 23 with the plate 12 in abutment with the thermal interface material 28. The assembly is processed in a wave solder pre-heat process which softens or melts the thermal interface material 28 to provide intimate thermal contact between the SMT component 24 and the plate 12. A wave soldering process is used to solder the mounting pins 14 to the plated through holes 23, to produce solder bonds 29, fixing the stiffening member 10 to the system substrate 20 with the plate 12 in thermal contact with the SMT component 24. Wave soldering of the stiffening member 10 is performed in the same wave soldering operation as for the other wave soldered components.

Figure 3A:
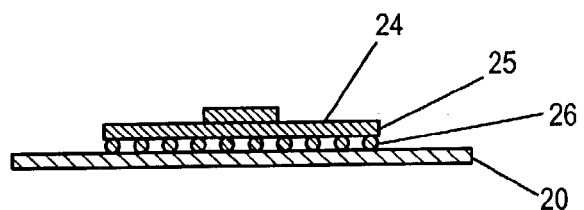
FIGS. 3A and 3B illustrate the effectiveness of the stiffening member to prevent flexing of the system substrate spanned by the stiffening member.
Figure 3B:
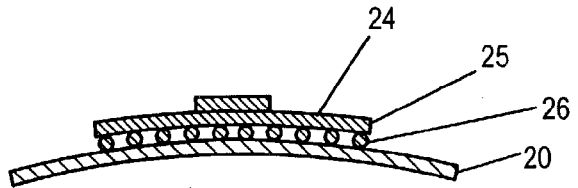

FIGS. 3A and 3B illustrate the effectiveness of the stiffening member 10 to prevent flexing of the system substrate 20 spanned by the stiffening member 10. FIG. 3A is a side view of a system substrate 20 and a SMT component 24 interconnected with BGA interconnects 26. FIG. 3B is a side view of a system substrate 20 and a SMT component 24 subjected to a load sufficient to cause flexing of the system substrate 20 under the SMT component 24. Under loading conditions, the SMT interconnects 26 between the system substrate 20 and the carrier substrate 25 of the SMT component 24 is subjected to stresses which can lead to SMT interconnect 26 failure.

Figure 4:
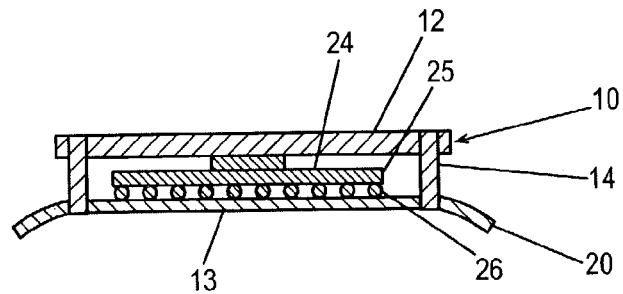
FIG. 4 is a side view of a system substrate and a SMT component with the addition of a stiffening member in accordance with an embodiment of the present invention.

FIG. 4 is a side view of a system substrate 20 and a SMT component 24 with the addition of a stiffening member 10 in accordance with an embodiment of the present invention. The stiffening member 10 supports the system substrate 20 to prevent bending and flexing of the spanned portion 13 under the plate 12. The stiffening member 10 prevents the system substrate 20 from deforming in a direction perpendicular to the system substrate 20. This is the direction of shock that causes most damage to the SMT interconnects 26. FIGS. 3A and 3B and 4 are simplified representations; actual performance will depend on other considerations, such as the presence of other components and system substrate 20 to chassis mounting points, among others.

In other embodiments in accordance with the present invention, the plate 12 comprises other configurations, such as, but not limited to, a rectangle and a square. The choice of configuration of the plate 12 is predetermined to provide sufficient support to the system substrate 20, as well as other considerations, such as, but not limited to, to provide sufficient support to accommodate an attached heat dissipation device.

Figure 5:
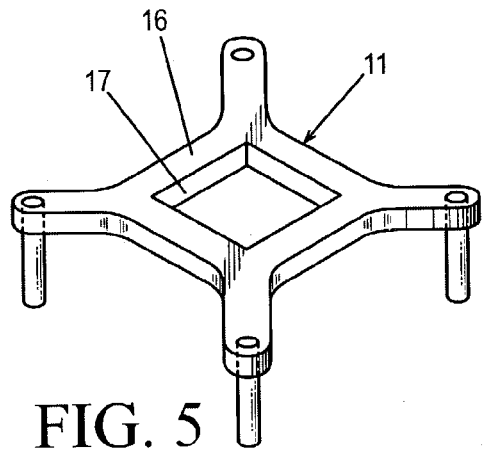
FIGS. 5 and 6 are perspective and side views, respectively, of another embodiment of a stiffening member in accordance with the present invention.
Figure 6:
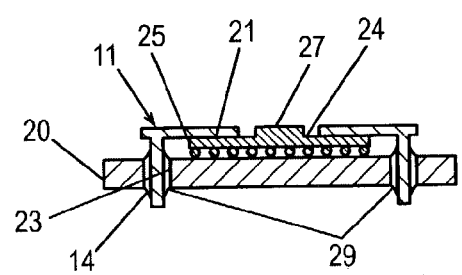

The plate 12 in FIG. 1 has a continuous flat surface. FIGS. 5 and 6 are perspective and side views, respectively, of another embodiment of a stiffening member 11 in accordance with the present invention. The plate 16 has an aperture 17 to serve as a frame through which a SMT component 24 may protrude. In one embodiment in accordance with the present invention, the aperture 17 is of a predetermined size and configuration to accommodate the protruding die 27 of a SMT component 24, wherein the plate 16 rests on the top surface 21 of the carrier substrate 25 upon which the die 27 is coupled, without contacting the die 27.

Figure 7:
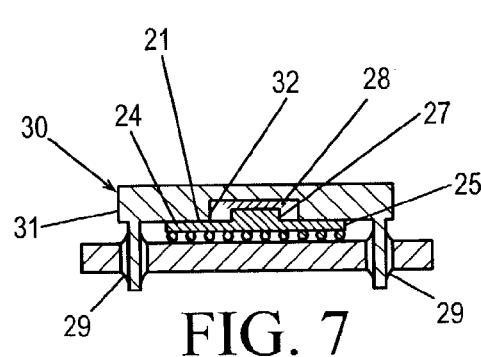
FIG. 7 is a side view of another embodiment of a stiffening member in accordance with the present invention.

FIG. 7 is a side view of another embodiment of a stiffening member 30 in accordance with the present invention. The plate 31 has a central recess 32 to accommodate the height of the die 27 such that the plate 12 is placed in contact with both the die 27 and the carrier substrate 25. The plate 12 is adapted to be in direct contact with the top surface 21 of the carrier substrate 25, as well as adapted to accommodate thermal interconnect material 28 between the plate 31 and the die 27.

Referring again to FIG. 1, the arrangement of the mounting pins 14 about the plate 12 is predetermined, in part, by consideration of the size of SMT component 24 upon which the stiffening member 10 is mounted and the location of available plated through-holes on the system substrate 20. The number of mounting pins 14 is predetermined considering the amount of support each mounting pin 14 is required to provide the system substrate 20 and the degree of loading the plate 12 is expected to resist.

Figure 8:
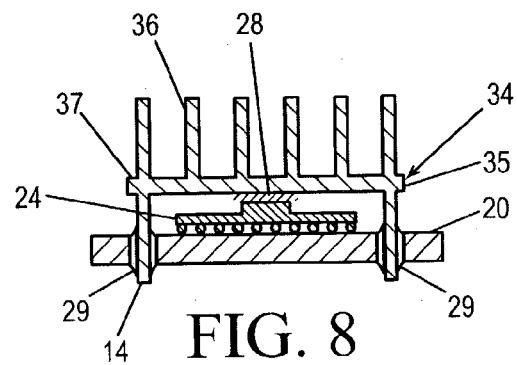
FIG. 8 is a side view of another embodiment of a stiffening member in accordance with the present invention.

FIG. 8 is a side view of another embodiment of a stiffening member 34 in accordance with the present invention. The plate 35 further comprises heat-dissipation structures 36, such as, but not limited to, fins and pins, which project from the side 37 opposite to the mounting pins 14. The stiffening member 10 provides support for the system substrate 20 as well as provides heat dissipation for the SMT component 24 upon which it is coupled.

In other embodiments of the stiffening member in accordance with the present invention (not shown), the stiffening member further comprises mounting features to accommodate the attachment of a heat dissipation device, such as, but not limited to, a heatsink and a fan. Embodiments of mounting features include, but are not limited to, retention clips and fastener apertures.

In other embodiments in accordance with the present invention (not shown), heat sinks are provided with wave solderable mounting pins adapted to be inserted into plated through holes of a system substrate. A heatsink manufactured with an edge flange is fitted with mounting pins. The mounting pins are coupled to the flange using suitable methods, such as, but not limited to, punch or drill and press-fit insertion. In another embodiment, the mounting pins are integral to the casting of the heatsink.

Finite element analysis (FEA) was used to evaluate the effectiveness of the embodiment of the stiffening member 10 of FIG. 1 subjected to a board-level shock condition consistent with standard testing procedures. The BGA SMT interconnects 26 of a SMT component 24 on an un-reinforced system substrate 20 experienced a maximum tensile load of 1.62 lb at the point of maximum heatsink acceleration. The BGA SMT interconnects 26 of a SMT component 24 supported by the wave-soldered stiffening member 10 experienced a maximum tensile load of 0.90 lb for the same shock condition. The tensile stress on the solder interconnections of the ball grid array of the SMT component 24 was reduced as much as 45% in a shock event compared to an un-reinforced system substrate 20. Performance of the stiffening member 10 can be improved and optimized with careful consideration to the orientation and placement of the mounting pins 14.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the art will readily appreciate that the present invention may be implemented in a very wide variety of embodiments. This application is intended to cover any adaptations or variations of the embodiments discussed herein. Therefore, it is manifestly intended that this invention be limited only by the claims and the equivalents thereof.

What is claimed is:

1. A stiffening member for reducing a substrate's flexible response to a loading, comprising:
    a plate including a plurality of corners, wherein each corner includes an extension, and wherein the plate is adapted with a stiffness selected to reduce the substrate's flexible response to a loading, is further adapted to come into thermal contact with an electronic component coupled to the substrate; and
    a plurality of mounting pins coupled to and orthogonally extending from the extensions of the plate to form a unitary body, the mounting pins configured to be inserted into corresponding plated through holes of the substrate from a front side of the substrate and secured to enable the plate to engage the substrate at a position providing a clearance between the plate and the front side of the substrate.

2. The stiffening member of claim 1, wherein the plurality of mounting pins are spaced apart a predetermined distance, and the plate is adapted to span across an electronic component coupled to the substrate.

3. The stiffening member of claim 1, wherein the plate further comprises an aperture adapted to accommodate a protrusion on an electronic component coupled to the substrate, and wherein the plate is adapted to contact a carrier substrate of the electronic component.

4. The stiffening member of claim 1, wherein the plate further comprises a recess portion adapted to accommodate and come into thermal contact with a protrusion on an electronic component coupled to the substrate, and wherein the plate is adapted to contact a carrier substrate of the electronic component.

5. The stiffening member of claim 1, wherein the plate further comprises a plurality of heat dissipation features.

6. The stiffening member of claim 5, wherein the plurality of heat dissipation features are selected from the group consisting of fins and pins.

7. The stiffening member of claim 1, wherein the plate further comprises one or more features adapted to couple with a heat dissipation device.

8. The stiffening member of claim 1, wherein the plurality of mounting pins are adapted with a length sufficient to define a cavity to accommodate at least an electronic component coupled to the substrate.

9. The stiffening member of claim 8, wherein the length of the plurality of mounting pins is sufficient to allow the cavity to additionally accommodate the thickness of the substrate and to allow for a predetermined protrusion of the plurality of mounting pins from the backside of the substrate.

10. A method for reinforcing a substrate having plated through holes and a flexible response to a loading, comprising:
    providing a stiffening member, comprising:
        a plate including a plurality of corners, wherein each corner includes an extension, and wherein the plate is adapted with a stiffness selected to reduce the substrate's flexible response to a loading; and
        a plurality of mounting pins coupled to and orthogonally extending from the extensions of the plate to form a unitary body, the mounting pins configured to be inserted into corresponding ones of plated through holes of the substrate from a front side of the substrate and secured to enable the plate to engage the substrate at a position providing a clearance between the plate and the front side of the substrate;
    inserting the mounting pins into corresponding plated through holes of the substrate from the front side of the substrate, the plate spanning one or more electronic components between the plate and the substrate;
    coupling the mounting pins to the substrate at a position to providing a clearance between the plate and the front side of the substrate; and
    placing the plate into thermal contact with at least one of the one or more electronic components prior to coupling the mounting pins to the substrate.

11. The method of claim 10 wherein coupling the mounting pins to the substrate comprises wave soldering the mounting pins to the substrate.

12. The method of claim 10, wherein the plate includes an aperture adapted to accommodate a protrusion on at least one of the one or more electronic components, and wherein the method further comprises placing the plate into engagement with the carrier substrate of at least one of the one or more electronic components.

13. The method of claim 10, wherein the plate includes a recess adapted to accommodate a protrusion on at least one of the one or more electronic components, and wherein the method further comprises placing a bottom surface of the recess into thermal contact with the protrusion on the at least one of the one or more electronic components; and
    placing the plate into engagement with the carrier substrate of the at least one of the one or more electronic components.

14. The method of claim 10, wherein the plate includes a plurality of heat dissipation features.

15. The method of claim 14, wherein the plurality of heat dissipation features are selected from the group consisting of fins and pins.

16. The method of claim 10, wherein the plate includes one or more features adapted to couple with a heat dissipation device and wherein the method further comprises coupling the heat dissipation device to the plate.

17. The method of claim 10, wherein the plurality of mounting pins are adapted with a length sufficient to define a cavity to accommodate at least an electronic component coupled to the substrate.

18. The method of claim 17, wherein the length of the plurality of mounting pins is sufficient to allow the cavity to additionally accommodate the thickness of the substrate and to allow for a predetermined protrusion of the plurality of mounting pins from the backside of the substrate.

19. A computing system, comprising:
    a substrate having plated through holes and a flexible response to a loading; and
    a stiffening member, comprising:

a plate including a plurality of corners, wherein each corner includes an extension, and wherein the plate is adapted with a stiffness selected to reduce the substrate's flexible response to a loading and adapted to come into thermal contact with an electronic component disposed on the substrate, spanned by the plate; and a plurality of mounting pins coupled to and orthogonally extending from the extensions of the plate to form a unitary body and extending into the plated through holes of the substrate, the mounting pins configured to be inserted into the plated through holes from the front side of the substrate and secured to the plated through holes to secure the plate to the substrate at a position providing a clearance between the plate and the front side of the substrate.

20. The computing system of claim 19, wherein the system further comprises one or more electronic components, the plurality of mounting pins are spaced apart a predetermined distance, and the plate is adapted to span across at least one of the one or more electronic components.

21. The computing system of claim 19, wherein the plate further comprises an aperture adapted to accommodate a protrusion on an electronic component spanned by the plate, and wherein the plate is adapted to contact a carrier substrate of the electronic component spanned by the plate.

22. The computing system of claim 19, wherein the plate further comprises a recess portion adapted to accommodate and come into thermal contact with a protrusion on an electronic component spanned by the plate, and wherein the plate is adapted to contact a carrier substrate of the electronic component spanned by the plate.

23. The computing system of claim 19, wherein the plate further comprises a plurality of heat dissipation features.

24. The computing system of claim 23, wherein the plurality of heat dissipation features are selected from the group consisting of fins and pins.

25. The computing system of claim 19, wherein the plate further comprises one or more features adapted to couple with a heat dissipation device.

26. The computing system of claim 19, wherein the plurality of mounting pins are adapted with a length sufficient to define a cavity to accommodate at least an electronic component coupled to the substrate.

27. The computing system of claim 26, wherein the length of the plurality of mounting pins is sufficient to allow the cavity to additionally accommodate the thickness of the substrate and to allow for a predetermined protrusion of the plurality of mounting pins from the backside of the substrate.

* * * * *

UNITED STATES PATENT AND TRADEMARK OFFICE
CERTIFICATE OF CORRECTION

PATENT NO. : 7,161,238 B2 Page 1 of 1
APPLICATION NO. : 10/335092
DATED : January 9, 2007
INVENTOR(S) : George Hsieh et al.

It is certified that error appears in the above-identified patent and that said Letters Patent is hereby corrected as shown below:

Column 5
Line 24, "...loading, is further,..." should read --...loading, and is further,...--.

Signed and Sealed this

Fifteenth Day of July, 2008

JON W. DUDAS
*Director of the United States Patent and Trademark Office*